United States Patent
Kim et al.

(10) Patent No.: US 7,561,475 B2
(45) Date of Patent: Jul. 14, 2009

(54) FLASH MEMORY CONTROLLER

(75) Inventors: Yong-Ji Kim, Paju-si (KR); Keon-Han Sohn, Yongin-si (KR); Chang-Il Son, Yongin-si (KR); Si-Yung Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/619,794

(22) Filed: Jan. 4, 2007

(65) Prior Publication Data
US 2007/0211557 A1 Sep. 13, 2007

(30) Foreign Application Priority Data
Jan. 4, 2006 (KR) .................. 10-2006-0001039

(51) Int. Cl.
*G11C 16/06* (2006.01)
(52) U.S. Cl. .............. 365/185.23; 365/185.17; 365/189.16
(58) Field of Classification Search .......... 365/223, 365/185.23, 185.17, 194; 375/355, 356
See application file for complete search history.

(56) References Cited
U.S. PATENT DOCUMENTS
2003/0112910 A1* 6/2003 Yoh et al. ................ 375/356
2006/0034404 A1* 2/2006 Sarda ...................... 375/354
2006/0250846 A1* 11/2006 Park ...................... 365/185.17

FOREIGN PATENT DOCUMENTS
| JP | 64-076486 | 3/1989 |
| JP | 01-154398 | 6/1989 |
| JP | 2001-331365 | 11/2001 |
| KR | 1020010105938 A | 11/2001 |

OTHER PUBLICATIONS

English Abstract for Publication No. 64-076486.
English Abstract for Publication No. 01-154398.
English Abstract for Publication No. 1020010105938 A.
English Abstract for Publication No. 2001-33165.

* cited by examiner

*Primary Examiner*—Hoai V Ho
*Assistant Examiner*—Fernando N Hidalgo
(74) *Attorney, Agent, or Firm*—F. Chau & Associates, LLC

(57) ABSTRACT

An apparatus for controlling a flash memory device which includes a signal generator for generating a clock signal at an operation, a first buffer for outputting the clock signal to the flash memory device as a clock enable signal, a second buffer for receiving data from the flash memory device in synchronization with the clock enable signal, a third buffer for receiving and outputting an output of the first buffer, and a latch circuit for latching an output of the second buffer in synchronization with output of the third buffer.

12 Claims, 5 Drawing Sheets

FLASH MEMORY CONTROLLER

CROSS-REFERENCE TO RELATED PATENT APPLICATION

This application claims priority to Korean Patent Application No. 10-2006-0001039, filed in the Korean Intellectual Property Office, on Jan. 4, 2006, the disclosure of which is incorporated by reference herein in its entirety

BACKGROUND OF THE INVENTION (a) Technical Field

The present disclosure relates to a memory controller, and more specifically to a device and method which can stably fetch data from a memory controller.

(b) Discussion of the Related Art

Large scale integrated circuits are manufactured using minimum feature size technologies, and these technologies cause considerable variations of device characteristics due to process, voltage and temperature PVT variations. The PVT variations can cause variations in rise and fall times of transmission signals, which in turn result in signal delays. Thus, it is beneficial to be able to adjust signal delay in various routes or paths in an integrated circuit so variations in signal delay caused by PVT can be minimized.

FIG. 1 is a block diagram showing a conventional flash memory controller.

The memory controller illustrated in the FIG. 1 controls a NAND flash memory device, and comprises a central processing unit CPU 120, RAM 140 operating as a buffer memory, and a flash interface controller 160. The central processing unit 120 is configured to control the overall operations of the memory controller. For example, the central processing unit 120 controls the flash interface controller 160 so that a read/write operation of the flash memory 200 is carried out based on a command from a host. The RAM 140 temporarily stores data from the host at a write operation and data read out from the flash memory 200 at a read operation. The RAM 140 may be embodied, for example, with SRAM. However, the RAM 140 can also be embodied using other RAMs such as DRAM, PRAM, MRAM, and the like. The flash interface controller 160 controls the read/write operation of the flash memory 200 based on the control of the central processing unit 120. For example, when the write operation is being performed, the flash interface controller 160 transmits temporarily stored data in the RAM 140 and a write command to the flash memory 200 in accordance with a given timing. When the read operation is being performed, the flash interface controller 160 transmits a read command to the flash memory 200 in accordance with a given timing, and transmits data from the flash memory 200 to the RAM 140 after a period of time has elapsed. The flash memory 200 has a command/address/data multiplexed 10 structure where addresses, data, and command are provided through a data path.

FIG. 2 is a block diagram showing a part of the flash interface controller illustrated in FIG. 1.

Referring to FIG. 2, the flash interface controller 160 comprises a flash control block 162 and a data latch block 164. The flash control block 162 is operated in synchronization with a system clock signal SCLK, and is configured to generate control signals (e.g., CLE, CEB WEB, REB, ALE, etc.) that are to be applied to the flash memory 200 in accordance with a given timing at respective modes of operation. The flash control block 162 comprises an output enable signal generator 162a, which generates a clock signal O_REB in synchronization with the system clock signal SCLK The generated clock signal O_REB is outputted as the output enable signal REB to the flash memory 200 through a buffer 101 connected to a pad PD1. Although only the signal generator 162a for generating the O_REB signal is illustrated in the flash control block 162, signal generators for generating other control signals are also provided in the flash control block 162.

During a write operation, the data latch block 164 receives data O_OUT (e.g., it is provided from RAM 140 in FIG. 1) to be transmitted to the flash memory 200, and outputs the inputted data to the flash memory 200 through a buffer 102 connected to a pad PD2. During a read operation, the data latch block 164 latches data DQ transferred from the flash memory 200 through a buffer 103 connected to the pad PD2, and outputs the latched data O_DIN to the RAM 140 in FIG. 1. The data latch block 164 comprises a data output latch 164a and a data input latch 164b. For convenience of illustration, a data latch structure for inputting/outputting only 1-bit data is illustrated in the figures. However a data latch structure for inputting/outputting more than one data bit may also be used. The data output latch 164a latches/outputs data in synchronization with the system clock signal SCLK at the write operation, while the data input latch 164b latches data in synchronization with the clock signal O_REB from the output enable signal generator 162a at the read operation.

To read data from the flash memory 200, as shown in FIG. 3, the flash control block 162 transmits a read command and an address to the flash memory 200 in accordance with a predetermined timing. After a given time, the flash control block 162 generates the clock signal O_REB as an output enable signal REB in response to interrupt information (e.g., R/>B) from the flash memory 200. The flash memory 200 sequentially outputs data (e.g., page data) in given units (e.g., ×8, ×16, ×32, etc.) in response to the output enable signal REB. The data latch block 164 of the flash interface controller 160 latches data transferred from the flash memory 200 through the buffer 103 in response to the O_REB signal. The data input latch 164b latches data from the flash memory 200 directly using the O_REB signal from the signal generator 162a. As also seen in FIG. 2 the O_REB signal is transmitted to the flash memory 200 through a signal route, which includes the buffer 101, the pad PD1 and is transmitted directly to the data input latch 164b. The O_REB signal is transmitted to the flash memory 200 and the data input latch 164a through different signal routes, respectively. A signal delay generated by such signal routes varies based on PVT variations. This means that delay of the output enable signal REB transmitted to the flash memory 200 can be different from delay of the output enable signal O_REB to the data input latch 164b based on PVT variations. The varying delays make it difficult to stably latch data from the flash memory 200. Thus there is a need for a device and a method which can stably fetch data from a memory controller.

SUMMARY OF THE INVENTION

An exemplary embodiment of the present invention provides an apparatus for controlling a flash memory device which comprises a signal generator for generating a clock signal at an operation, a first buffer for outputting the clock signal to the flash memory device as a clock enable signal, a second buffer for receiving data from the flash memory device in synchronization with the clock enable signal, a third buffer for receiving and outputting an output of the first buffer, and a latch circuit for latching an output of the second buffer in synchronization with output of the third buffer.

An exemplary embodiment of the present invention provides a memory controller for controlling a flash memory device which comprises a central processing unit CPU, a buffer RAM configured for temporarily storing data, and a flash interface controller for controlling an operation of the flash memory device in accordance with a control of the central processing unit, wherein the flash interface controller comprises a signal generator for generating a clock signal at the operation, a first buffer for outputting the clock signal to the flash memory device as a clock enable signal, a second buffer for receiving data from the flash memory device in synchronization with the clock enable signal, a third buffer for receiving and outputting an output of the first buffer, and a latch circuit for latching an output of the second buffer in synchronization with output of the third buffer.

An exemplary embodiment of the present invention provides a data latching method in a memory controller for controlling a flash memory device. The data latching method comprises generating a clock signal in synchronization with a system clock signal, outputting as an output enable signal the clock signal to the flash memory device through a first buffer and latching data from the flash memory apparatus through a second buffer, wherein an output of the second buffer is latched in synchronization with an output of the first latch that is provided through a third buffer.

DETAILED DESCRIPTION OF EXEMPLARY EMBODIMENTS

Figure 4:
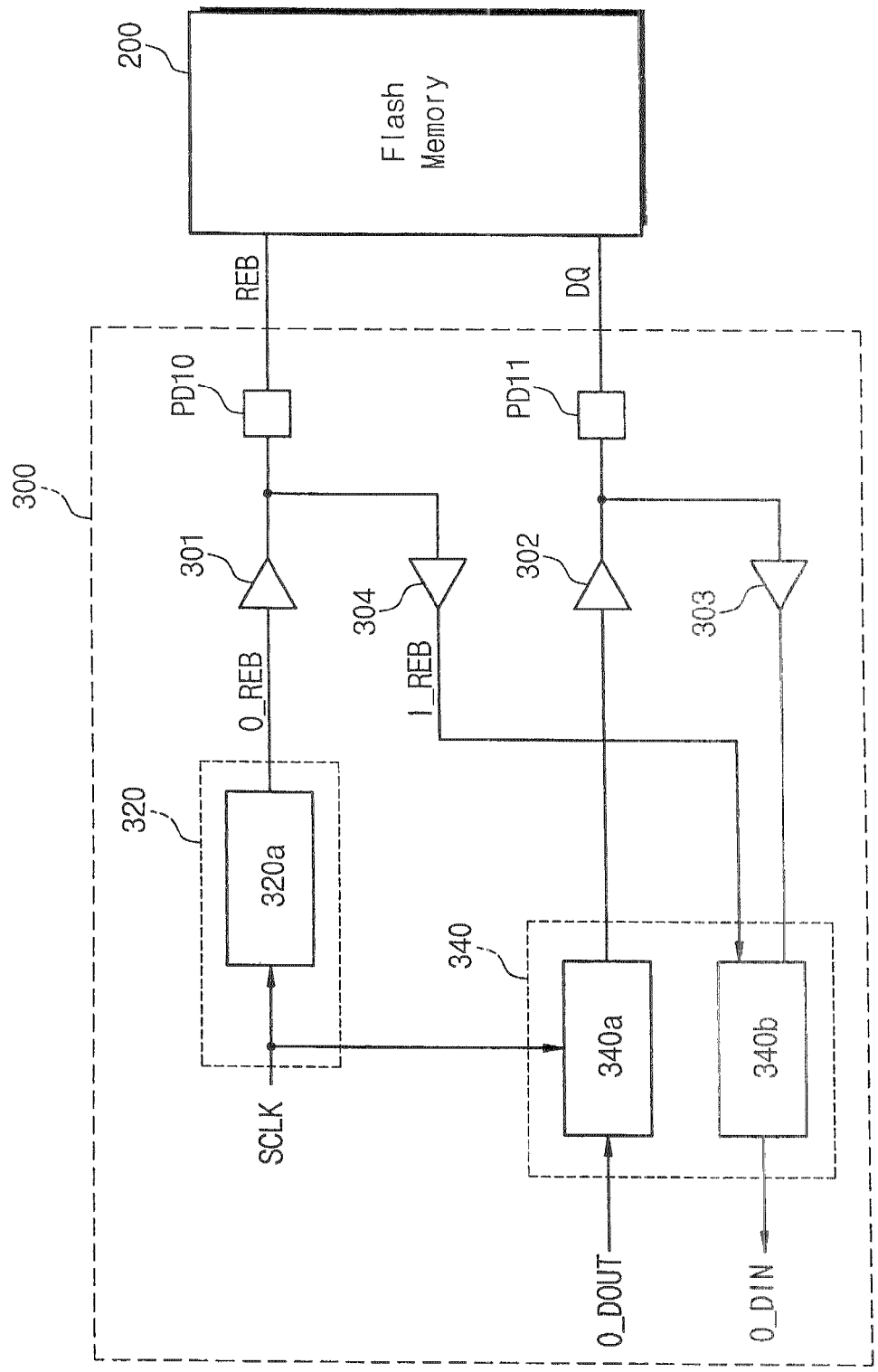
FIG. 4 is a block diagram showing a flash interface controller according to an exemplary embodiment of the present invention.

FIG. 4 is a block diagram showing a flash interface controller 300 according to an exemplary embodiment of the present invention.

Referring to FIG. 4, the flash interface controller 300 comprises a flash control block 320 and a data latch block 340. The flash control block 320 Is operated in synchronization with a system clock signal SCLK, and is configured to generate control signals (e.g., CLE, CEB, WEB, REB, ALE, etc.), which are to be applied to the flash memory 200. in accordance with a given timing at respective modes of operation. The flash control block 320 comprises an output enable signal generator 320a. The output enable signal generator 320a generates a clock signal O_REB in synchronization with the system clock signal SCLK. The generated clock signal O_REB is outputted as the output enable signal REB to the flash memory 200 through a buffer 301 connected to a pad PD10. Although only the signal generator 320a for generating the O_REB signal is illustrated in the flash control block 320, signal generators for generating other control signals are also provided in the flash control block 320.

Figure 1:
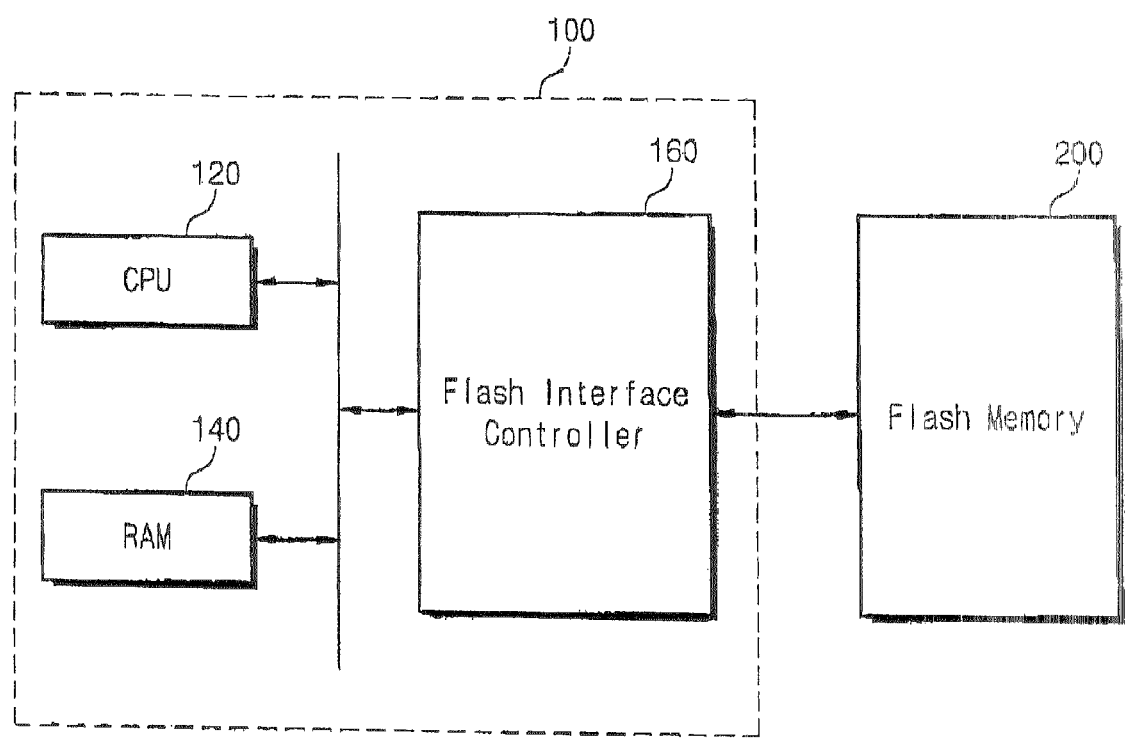
FIG. 1 is a block diagram showing a conventional flash memory controller.
Figure 2:
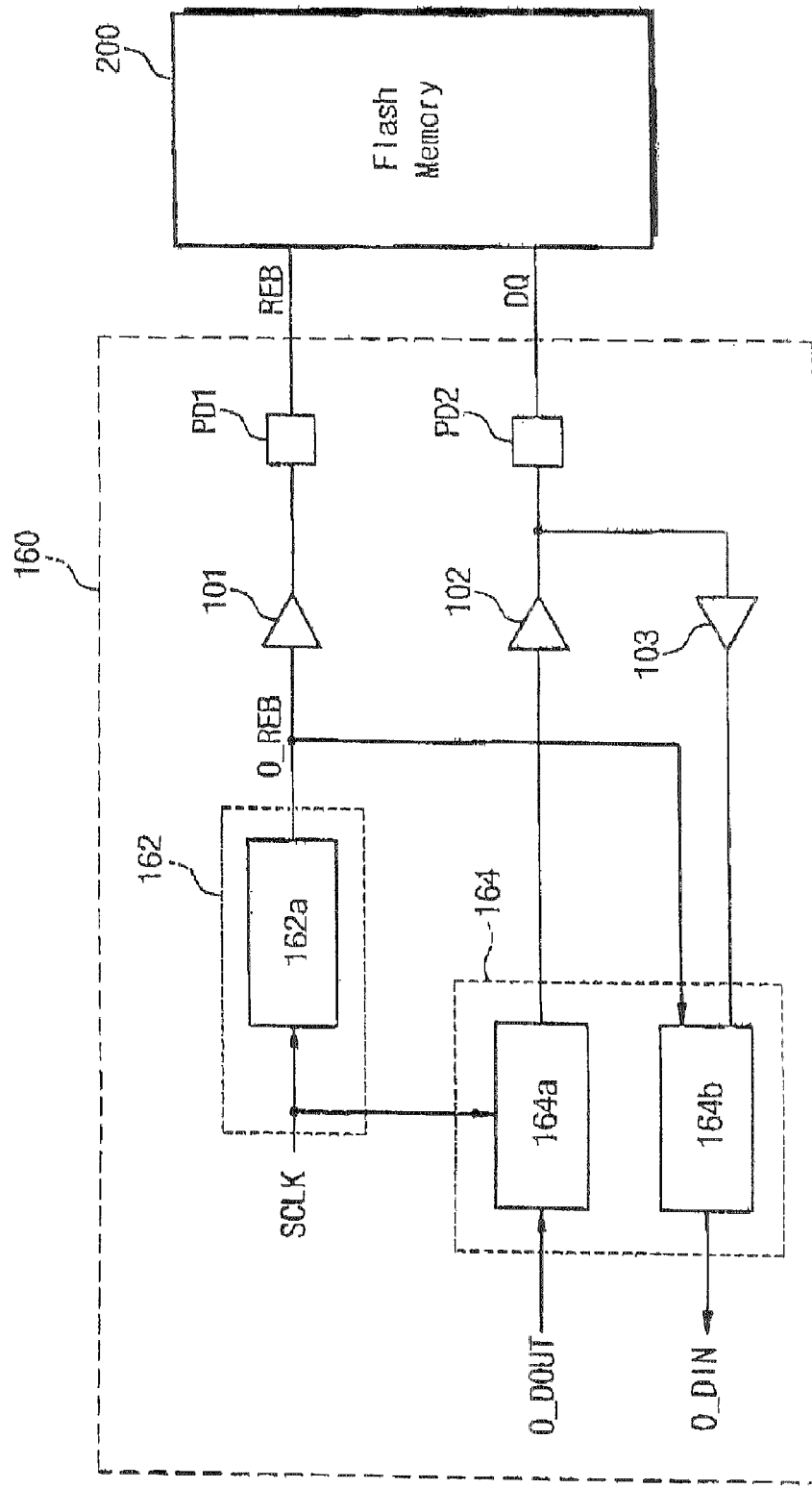
FIG. 2 is a block diagram showing a flash interface controller illustrated in FIG. 1.
Figure 3:
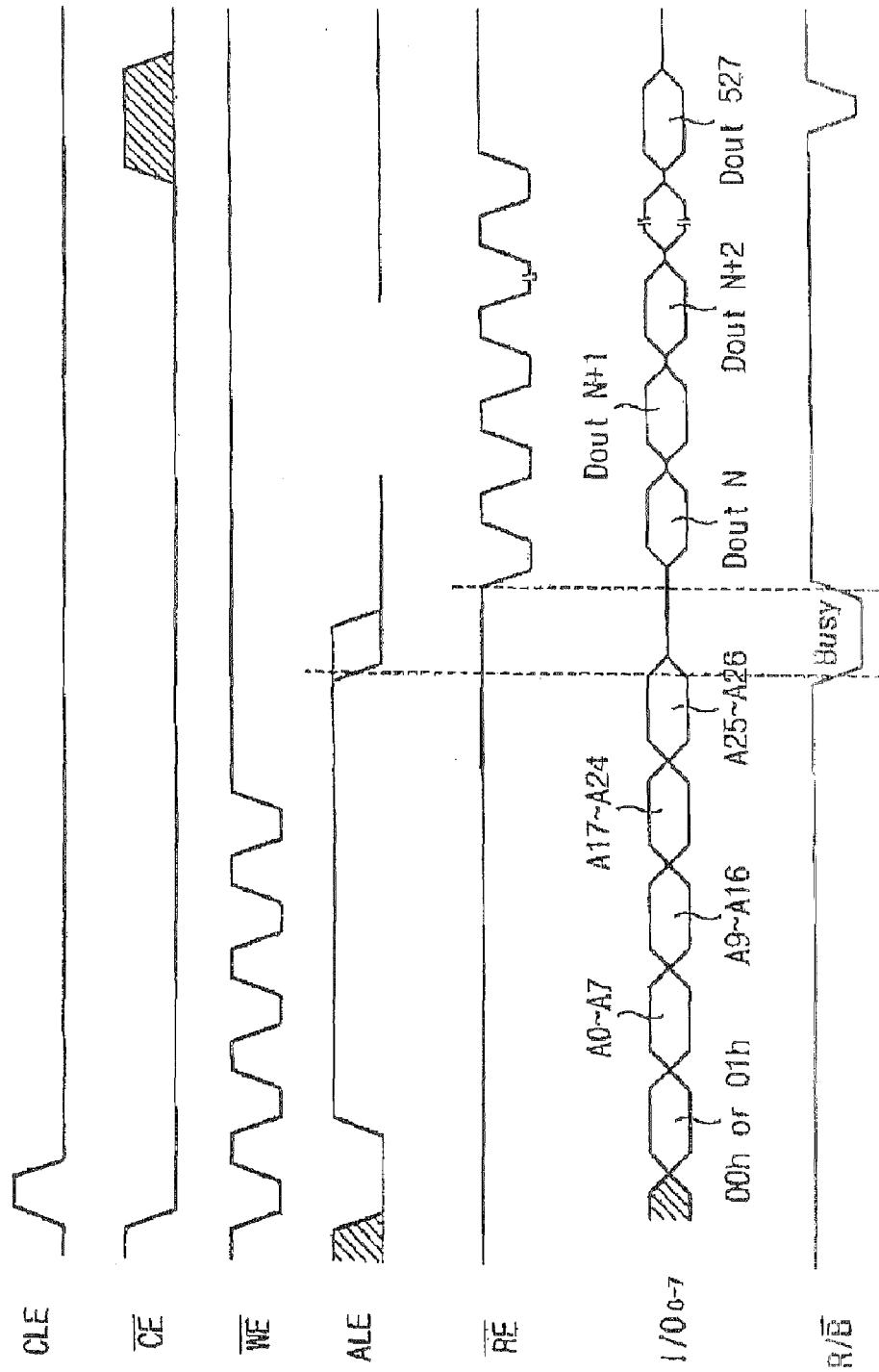
FIG. 3 is a drawing showing a timing of a read operation of a conventional flash memory.

During a write operation, a data latch block 340 receives data O_DOUT from the RAM 140 in FIG. 1 to be transferred to the flash memory 200 and outputs the inputted data O_DOUT to the flash memory 200 through a buffer 302 connected to a pad PD11. During a read operation, the data latch block 340 latches data DQ transferred from the flash memory 200 through a buffer 303 connected to the pad PD11, and outputs the latched data O_DIN to the RAM 140 in FIG. 1. The data latch block 340 comprises a data output latch 340a and a data input latch 340b. For convenience of illustration, a data latch structure for inputting/outputting only 1-bit data is illustrated in the figures. However, a data latch structure for inputting/outputting any number of data bits may be used. The data output latch 340a latches/outputs data in synchronization with the system clock signal SCLK at a write operation while the data input latch 340b latches data in synchronization with a latch signal I_REB from a buffer 304 at a read operation.

As illustrated in FIG. 4, the latch signal I_REB transmitted to the data input latch 340b is provided not directly from the signal generator 320a of the flash control block 320 but via the buffers 301,304 and signal lines. This means that a delay of the output enable signal REB transmitted to the flash memory 200 varies similarly with a delay from the latch signal O_REB to the data input latch 164b based on PVT variations. Based on PVT variations, delay of a transmission route where data from the flash memory 200 is transferred to the data input latch 304b varies similarly with the delay of a transmission route where the latch signal I_REB is transferred to the data input latch 340b. Due to these similarities, it is possible to stably latch data from the flash memory 200.

The flash control block 320 transmits a read command and an address to the flash memory 200 based on a given timing to read data from the flash memory 220. After a period of time has elapsed, the flash control block 320 generates a clock signal O_REB as an output enable signal REB in response to interrupt information (e.g., R/‾B) from the flash memory 200. The generated signal O_REB is transmitted as the output enable signal REB to the flash memory 200 through the buffer 301 and the pad PD10. An output of the buffer 301 is also transmitted as the latch signal I_REB to the data input latch 340b of the data latch block 340 through the buffer 304. The flash memory 200 sequentially outputs data (e.g., page data) by a given unit (e.g., ×8, ×16, ×32, etc.) in response to the output enable signal REB. The data latch block 340 of the flash interface controller 300, latches data output from the flash memory 200 through the buffer 303 in response to the latch signal I_REB from the buffer 304. Latched data O_DIN is transmitted to the RAM 140 illustrated in FIG. 1

Figure 5:
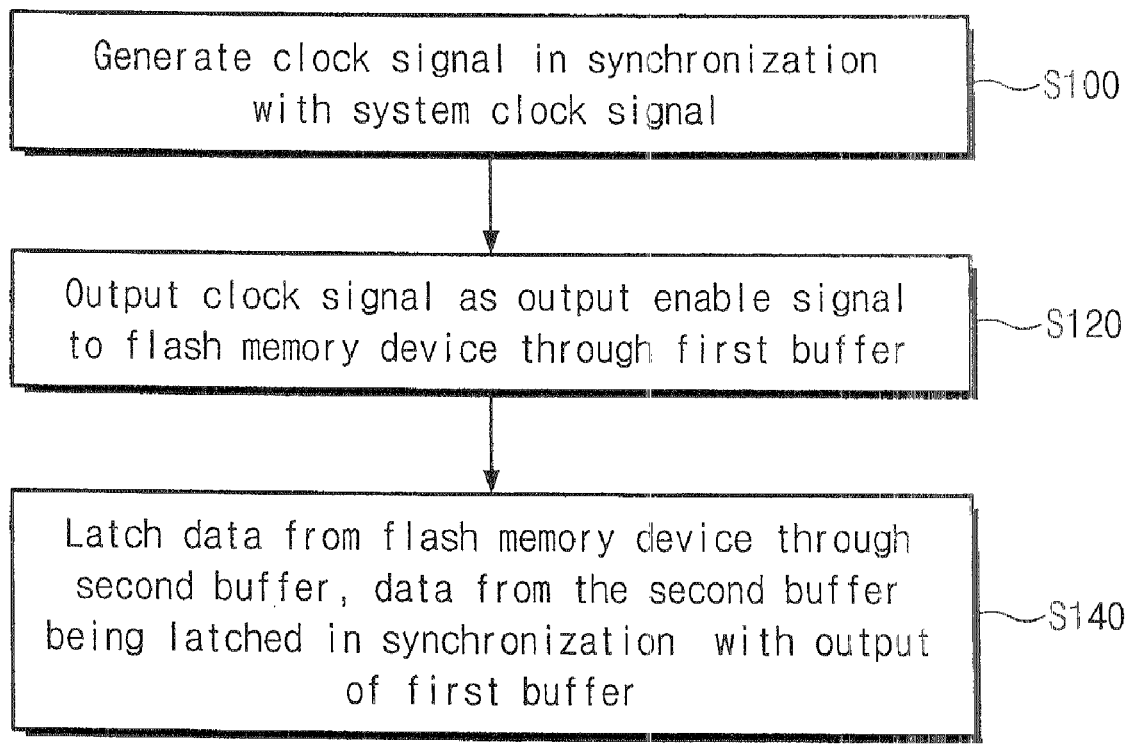
FIG. 5 is a flow chart describing a data latching method of a memory controller according to an exemplary embodiment of the present invention.

FIG. 5 is a flow chart for describing a data latching method of a memory controller for controlling a flash memory device according to an exemplary embodiment of the present invention.

Referring to FIG. 5, the data latching method comprises generating a clock signal in synchronization with a system clock signal (S100), outputting as an output enable signal the clock signal to a flash memory device through a first buffer (S120), and latching data from the flash memory device through a second buffer (S140). An output of the second buffer is latched in synchronization with an output of the first latch that is provided through a third latch. Herein, the flash memory device outputs data in synchronization with an output enable signal.

As described above, a flash memory can be stably latched regardless of PVT variations by latching data from the flash memory using a latch signal that is transferred via a signal path/route consisting of delay elements similar with those of a data input path/route.

While the invention has been particularly shown and described with reference to exemplary embodiments thereof, it will be understood by those skilled in the art that various changes in form and details may be made without departing from the spirit and scope of the invention. In the foregoing specification, if modifications and changes of the present invention belong to the scope of the claims and the like, it will be considered that the present invention includes those modifications and changes.

What is claimed is:

1. An apparatus for controlling a flash memory device, the apparatus comprising:
   a signal generator for generating a clock signal for an operation;
   a first buffer disposed along a first clock signal path and electrically connected between the signal generator and the flash memory device,
   wherein the first buffer receives the clock signal and outputs a clock enable signal along the first clock signal path to a first terminal of the flash memory device based on the clock signal;
   a latch circuit;
   a second buffer disposed along a data path and electrically connected between a second terminal of the flash memory device and a data input of the latch circuit,
   wherein the second buffer receives data along the data path from the flash memory device in synchronization with the clock enable signal;
   a third buffer disposed along a second clock signal path and electrically connected at an input end to an output of the first buffer and the first terminal of the flash memory device and at an output end to a latching input of the latch circuit,
   wherein the third buffer receives the clock enable signal from the first buffer and outputs a latch signal along the second clock signal path to the latching input of the latch circuit based on the output of the first buffer, and
   wherein the latch circuit latches an output of the second buffer in synchronization with the latch signal output from the third buffer.

2. The apparatus for controlling the flash memory device of claim 1, wherein the signal generator generates the clock signal in synchronization with a system clock signal.

3. The apparatus for controlling the flash memory device of claim 1, wherein the flash memory device is a NAND flash memory device.

4. The apparatus for controlling the flash memory device of claim 1, wherein the operation is a read operation.

5. A memory controller for controlling a flash memory device, the memory controller comprising:
   a central processing unit CPU;
   a buffer RAM configured for temporarily storing data; and
   a flash interface controller for controlling an operation of the flash memory device,
   wherein the flash interface controller comprises:
   a signal generator for generating a clock signal for an operation;
   a first buffer disposed along a first clock signal path and electrically connected between the signal generator and the flash memory device,
   wherein the first buffer receives the clock signal and outputs a clock enable signal along the first clock signal path to a first terminal of the flash memory device based on the clock signal;
   a latch circuit;
   a second buffer disposed along a data path and electrically connected between a second terminal of the flash memory device and a data input of the latch circuit,
   wherein the second buffer receives data along the data path from the flash memory device in synchronization with the clock enable signal;
   a third buffer disposed along a second clock signal path and electrically connected at an input end to an output of the first buffer and the first terminal of the flash memory device and at an output end to a latching input of the latch circuit,
   wherein the third buffer receives the clock enable signal from the first buffer and outputs a latch signal along the second clock signal path to the latching input of the latch circuit based on the output of the first buffer, and
   wherein the latch circuit latches an output of the second buffer in synchronization with the latch signal output from the third buffer.

6. The memory controller for controlling the flash memory apparatus of claim 5, wherein the signal generator generates the clock signal in synchronization with a system clock signal at the operation.

7. The memory controller for controlling the flash memory apparatus of claim 5, wherein the flash memory device is a NAND flash memory device.

8. The memory controller for controlling the flash memory apparatus of claim 5, wherein the operation is a read operation.

9. A data latching method in a memory controller for controlling a flash memory device, the method comprising:
   generating a clock signal in synchronization with a system clock signal;
   delaying the clock signal along a first clock path using a first buffer to generate an output enable signal
   outputting the output enable signal to a first terminal of the flash memory device;
   delaying an output of the first buffer along a second clock path using a third clock buffer to generate a latch signal;
   outputting data along a data path from a second terminal of the flash memory in response to the output enable signal to a second buffer; and
   latching an output of the second buffer into a latch in synchronization with the latch signal provided by the third buffer,
   wherein the third buffer is electrically connected at an input end to an output of the first buffer and the first terminal of the flash memory device and at an output end to a latching input of the latch.

10. The data latching method of claim 9, wherein the flash memory device outputs the data in synchronization with the output enable signal.

11. The data latching method of claim 9, wherein the clock signal is generated during an operation of the flash memory device.

12. The data latching method of claim 11, wherein the operation is a read operation.

* * * * *